(12) United States Patent
Takada et al.

(10) Patent No.: US 7,426,016 B2
(45) Date of Patent: Sep. 16, 2008

(54) EXPOSURE APPARATUS AND EXPOSURE METHOD

(75) Inventors: Noritoshi Takada, Toyama (JP); Seiji Tanaka, Toyama (JP); Kenji Noda, Toyama (JP); Hidekazu Kitahara, Toyama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/984,351

(22) Filed: Nov. 16, 2007

(65) Prior Publication Data
US 2008/0129978 A1    Jun. 5, 2008

(30) Foreign Application Priority Data
Nov. 30, 2006    (JP) .............................. 2006-322930

(51) Int. Cl.
*G03B 27/42*    (2006.01)
*G03B 27/52*    (2006.01)

(52) U.S. Cl. .......................................... 355/53; 355/55

(58) Field of Classification Search .................. 355/30, 355/52, 53, 55, 67, 77; 250/548; 356/237.2, 356/399–401
See application file for complete search history.

(56) References Cited

U.S. PATENT DOCUMENTS 5,502,311 A * 3/1996 Imai et al. .................... 250/548
6,130,751 A * 10/2000 Haginiwa et al. ........... 356/401
6,549,271 B2 * 4/2003 Yasuda et al. ................. 355/55

FOREIGN PATENT DOCUMENTS

JP    2003-257847    9/2003
JP    2006-093316    4/2006

* cited by examiner

*Primary Examiner*—Hung Henry Nguyen
(74) *Attorney, Agent, or Firm*—McDermott Will & Emery LLP

(57) ABSTRACT

According to an exposure apparatus and an exposure method in the present invention, based on a focus value and a leveling value in each exposure shot calculated based on measurements by a focus sensor, differential absolute value for respective value are calculated. The differential absolute values for the focus values and leveling vaule are compared with predetermined threshold vaule for the respective differential absolute values. When the differential absolute values exceed the threshold value, it is determined that an exposure abnormality exists. In such case, based at least the number of exposure area where the exposure abnormality is occurred and distribution of the exposure area where the exposure abnormality is occurred on the object to be exposed, a kind of the exposure abnormality is identifed. The detection of the exposure abnormality is assured, and a cause of the abnormality is determined without lowering manufacturing capabilities and increasing in cost.

22 Claims, 10 Drawing Sheets

→ Wafer Transferring Route in Normal Case
┄┄► Wafer Transferring Route in Abnormal Case

EXPOSURE APPARATUS AND EXPOSURE METHOD

CROSS-REFERENCE TO RELATED APPLICATION

The present application claims the benefit of Japanese Patent Application No. 2006-322930 filed Nov. 30, 2006, the subject matter of which is incorporated herein by reference.

BACKGROUND OF THE INVENTION

1. Field of the Invention

The present invention relates to an exposure apparatus and an exposure method utilized for manufacturing process of semiconductor devices and so forth.

2. Description of the Related Art

In an exposure apparatus and an exposure method utilized for manufacturing process of semiconductor devices, as the semiconductor devices have become finer, pattern defects caused by minute abnormal focus during exposure, ununiformity application of photoresist and the like have been occurred. Such pattern defects result in performance degradation and decreasing in yield, thereby it is necessary to restrain the occurrence.

As a method for restraining the occurrence of the pattern defects, it is conventionally proposed that measurement of a focus value in a plurality of positions within an exposure area of an exposure apparatus is performed, and, based on the focus value, local defocusing caused by foreign material on a rear surface is detected (for example, see Japanese Laid-Open Patent Publication No. 2003-257847). It is further proposed that a tilting value of a wafer stage in the exposure apparatus is measured every time exposure is performed, and defocusing is highly precisely detected based on the tilting value (for example, see Japanese Laid-Open Patent Publication No. 2006-93316).

An example of a conventional exposure apparatus and exposure method is described hereinafter referring to the drawings. FIG. 9 is a schematic structural view showing a principal part of the conventional exposure apparatus. In FIG. 9, exposure light 87 passed through a reduction projection lens 81 forms an image on a wafer 86. A wafer stage 85, on which the wafer 86 is mounted, is comprised to be drivable to Z direction (an optical-axis direction). While, the wafer stage 85 is provided on a wafer stage 84 which is comprised to be movable to X direction and Y direction (horizontal directions). A controller 89 controls driving of the wafer stages 84 and 85.

In a light receiving unit 82, light irradiated from a light emission unit 83 and reflected on the wafer 86 is incoming, thereby a signal according to incident light is generated. Using the signal generated in the light receiving unit 82, a focus detecting module 88 measures distance between an optical image plane of the reduction projection lens 81 and the surface of the wafer 86. A data storage unit 90 stores every kind of data obtained at every exposure shot, and based on the stored data determines existence/nonexistence of defocusing. A recording unit 91 records information of abnormality occurred on the wafer.

FIG. 10 is a flow chart showing a foreign material detecting algorithm performed in the above described exposure apparatus. First, as shown in FIG. 10, the wafer 86 which is an object to be exposed is carried onto the wafer stage 85 (Step 801). Next, the wafer 86 moved onto the wafer stage 85 and a reticle are globally aligned (Step 802). When the alignment is completed, a first exposure shot on the wafer 86 is moved to a projection position of the reduction projection lens 81 (Step 803). At this time, the focus detecting module 88 performs focus measurement for the exposure shot on the wafer 86 (Step 804). A controller 89 drives the wafer stage 85, based on the focus value obtained by the focus measurement, to a state that the surface of the wafer 86 is coincided with the optical image plane of the reduction projection lens 81. Then, a driving volume focus (Z position) and the tilting value for the wafer stage 85 are stored in the data storage unit 90 (Step 805). After that, the exposure to the shot is conducted (Step 806 and Step 807). Until the exposure to all exposure shots (from a first shot to n shot) on the wafer 86 is completed, Step 803 to Step 807 are repeatedly operated (Step 808 Yes). The wafer 86, on which the exposure is completed, is carried out from the exposure apparatus (Step 808 No, Step 809 and Step 811).

When the exposure operation is completed on the wafer 86, the Z position and the tilting value from the first shot to n shot stored on the data storage unit 90 are compared with the predetermined threshold value (Step 810). When the tilting value is higher than the specific threshold value, it is determined that foreign material exists between the rear surface of the wafer and the wafer stage.

The foreign material attached to the rear surface can be detected by performing the above-described process to every wafer which is an object to be exposed.

SUMMARY OF THE INVENTION

In the conventional configuration as described above, detection of an abnormality is performed by comparing data obtained from each exposure shot with the specific threshold value, thereby it is possible to accurately detect defocusing caused by local foreign material on the rear surface of the wafer. In this configuration, however, it is difficult to detect the abnormality in which an extreme fluctuation at the Z position and the tilting value does not occur, and which is successively occurred in relatively wide range. Abnormalities are exemplified as those caused by application of photoresist, attachment of film-formed foreign material on the rear surface of the wafer in wide range, and the like.

Further, in the conventional configuration, there is a problem that the cause of defocusing is not determined whether the detected abnormality is caused by foreign material attached locally on the rear surface of the wafer, or at the edge of the abnormal area where abnormality is successively occurred in the relatively wide range, and the like. In order to solve such problems, it is considered that visual observation of the entire wafer on which abnormality is detected, however that will result in lowering the production capabilities and increasing in costs.

In view of the above problems, an object of the present invention is to provide an exposure apparatus and an exposure method in which detection of an exposure abnormality is assured and a cause of abnormality is determined without causing lowering the production capabilities and increasing in costs.

In order to solve the above problems, this invention employs the following technical means. The present invention is on the premise that an exposure apparatus, for example a step-and-repeat system or a step-and-scan system, measuring a surface position of an object to be exposed mounted on a stage and exposing a surface of the object to be exposed in a state that the object surface is coincided with a base plane set at a desired position. The exposure apparatus according to the present invention is provided with a focus sensor measuring the surface position of the object at at least more than two points within an exposure area (an exposure shot). On the basis of a result of the measurement by the focus sensor, a distance between the base plane and the object surface and a leveling value of the object surface relative to the base plane are calculated in a plurality of exposure areas arranged on the object. The calculation as described above may be performed by the focus sensor. Further, a driving unit, which makes fine adjustment to a position of the stage in vertical direction and the leveling value of the object surface on the stage relative to a base plane, may perform the calculation. The calculated distance and the calculated leveling value are stored in a storage unit being associated with the position information of the exposure area performed the calculation on the object surface. Then, a determination unit determines existence or nonexistence of an exposure abnormality based on the associated information and predetermined abnormal determination criteria. In case that the determination unit determines that the exposure abnormality exists, an identification unit to identify a kind of the exposure abnormality at least based on the number of the exposure areas where the exposure abnormality is occurred and distribution of the exposure areas where the exposure abnormality is occurred on the object surface.

In addition to the above-described structure, it may be provided that a display unit (an information unit) for displaying a result of the existence or the nonexistence of the exposure abnormality determined by the determination unit together with information of the object including the position information of the exposure area on the object surface and information to identify the object. For example, the display unit can adopt a structure of displaying by distinguishing areas determined as abnormal with areas determined as normal by the determination unit on a map showing the object surface.

Furthermore, the identification unit can adopt a structure of identifying an exposure abnormality as the exposure abnormality caused by foreign material on a rear surface of the object when the exposure abnormality does not exist in exposure areas adjacent to the exposure area where the exposure abnormality is detected. Similarly, the identification unit can adopt the structure of identifying the abnormality as the abnormality caused by an application of chemical solution applied on the object surface when the abnormality exists in exposure areas adjacent to the exposure area where the exposure abnormality is detected.

Additionally, it may be provided that an operation unit for calculating difference between the calculated value in each exposure area and the calculated value in the exposure area where the surface position is measured immediately before the each exposure area with respect to the distance and the leveling value respectively. In this case, the determination unit determines the existence or the nonexistence of the exposure abnormality by comparing the difference in the distance and the difference in the leveling value with predetermined threshold values for the respective differences.

In the meantime, from another point of view, the present invention can provide an exposure method measuring a surface position of an object to be exposed mounted on a stage and exposing a surface of the object in a state that the object surface is coincided with a base plane set at a desired position. That is, in the exposure method according to the present invention, the surface position of the object is measured at least more than two points in an exposure area (an exposure shot). Then, on the basis of a result of the measurement, a distance between the base plane and the object surface and a leveling value of the object surface relative to the base plane are calculated in a plurality of exposure areas arranged on the object. The calculated distance and calculated leveling value are associated with position information of the exposure area performed the calculation on the object surface. Existence or nonexistence of an exposure abnormality is determined based on the associated information and predetermined abnormal determination criteria. In case that the exposure abnormality is determined as existing, a kind of the exposure abnormality is identified at least based on the number of the exposure areas where the exposure abnormality is occurred and distribution of the exposure areas where the exposure abnormality is occurred on the object surface.

In addition to the above configuration, a configuration of displaying the determined result of the existence or the nonexistence of the exposure abnormality together with information of the object including the position information of the exposure area on the object surface and information to identify the object can be adopted. For example, the result of the existence or the nonexistence of the exposure abnormality can be displayed by distinguishing areas determined as abnormal with areas determined as normal on a map showing the object surface.

In the step of identifying a kind of the exposure abnormality, a configuration may be adopted that the exposure abnormality is identified as that caused by foreign material on a rear surface of the object when the exposure abnormality does not exist in exposure areas adjacent to the exposure area where the exposure abnormality is detected. Similarly, in the step of identifying the existence or the nonexistence of the exposure abnormality, a configuration may be adopted that the exposure abnormality is identified as that caused by an application of chemical solution applied on the object surface, when the exposure abnormality exists in exposure areas adjacent to the exposure area where the exposure abnormality is detected.

Additionally, a configuration of calculating difference between the calculated value in each exposure area and the calculated value in the exposure area where the surface position is measured immediately before the each exposure area with respect to the distance and the leveling value respectively can be adopted. In this case, the determination of the existence or the nonexistence of the exposure abnormality is performed by comparing the difference in the distance and the difference in the leveling value with predetermined threshold values for the respective differences.

Further, a configuration that when being determined that the abnormality exists in the step of determining the existence or the nonexistent of the exposure abnormality, removing chemical solution applied on the surface of the object which is determined that the exposure abnormality exists and re-applying chemical solution on the surface of the object where the chemical solution is removed can be adopted. In case that the chemical solution is photoresist, the photoresist is removed from the object which is determined as abnormal by applying, for example, thinner used as a solvent for the photoresist.

According to the present invention, not only abnormalities which are occurred locally caused by attachment of minute foreign material on the rear surface of the wafer but also abnormalities which are occurred in relatively broad area caused by abnormal application of photoresist can be detected. Then, such abnormalities can be detected distinguishingly, so that the cause of the abnormality is specified without lowering the production capabilities and increasing in costs.

The foregoing and other objects, features, aspects and advantages of the present invention will become more apparent from the following detailed description of the present invention when taken in conjunction with the accompanying drawings.

DESCRIPTION OF PREFERRED EMBODIMENTS

First Embodiment

An exposure apparatus and an exposure method according to the first embodiment of the present invention are described hereinafter with reference to the drawings. The exposure apparatus in the present invention is a reduction projection exposure apparatus based on step-and-repeat system (so-called stepper).

Figure 1:
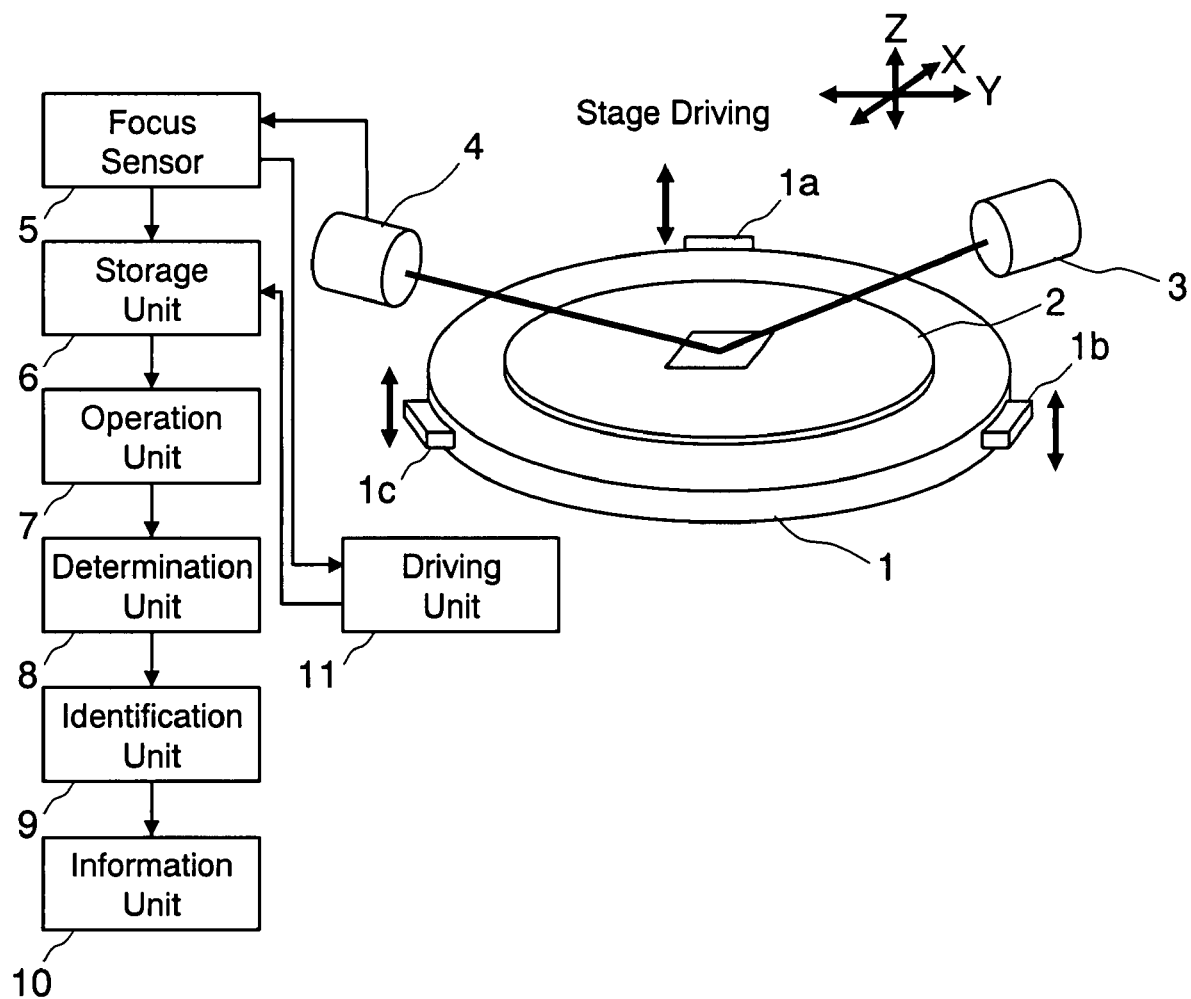
FIG. 1 is a schematic structural view showing an exposure apparatus according to the first embodiment of the present invention.
Figure 9:
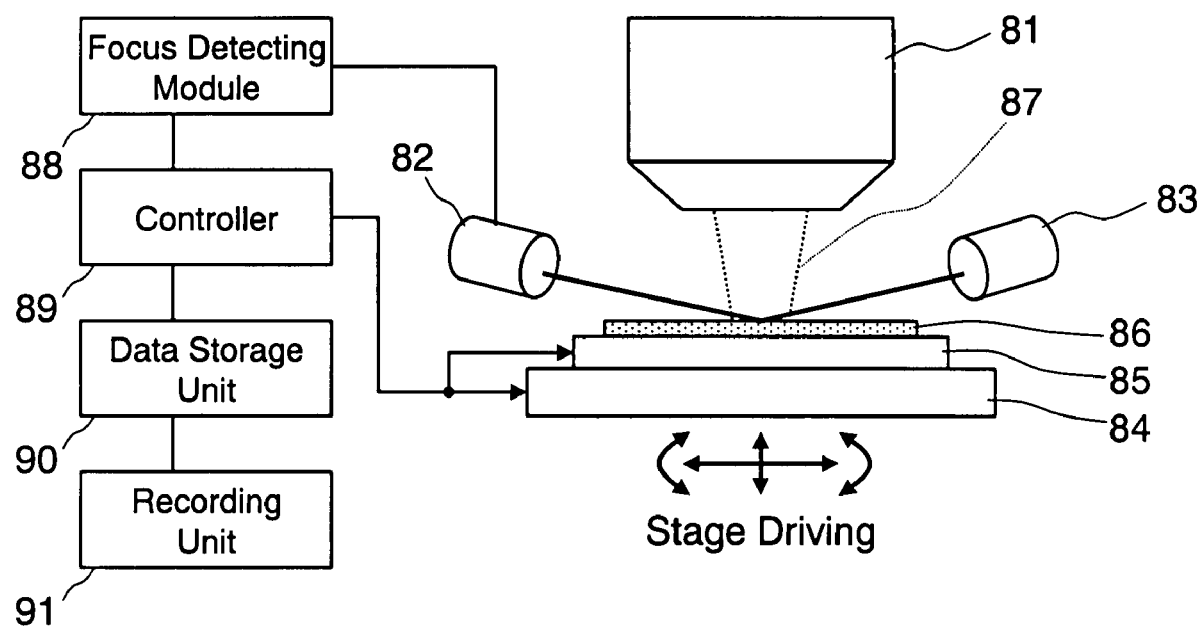
FIG. 9 is a schematic structural view showing the conventional exposure apparatus.
Figure 10:
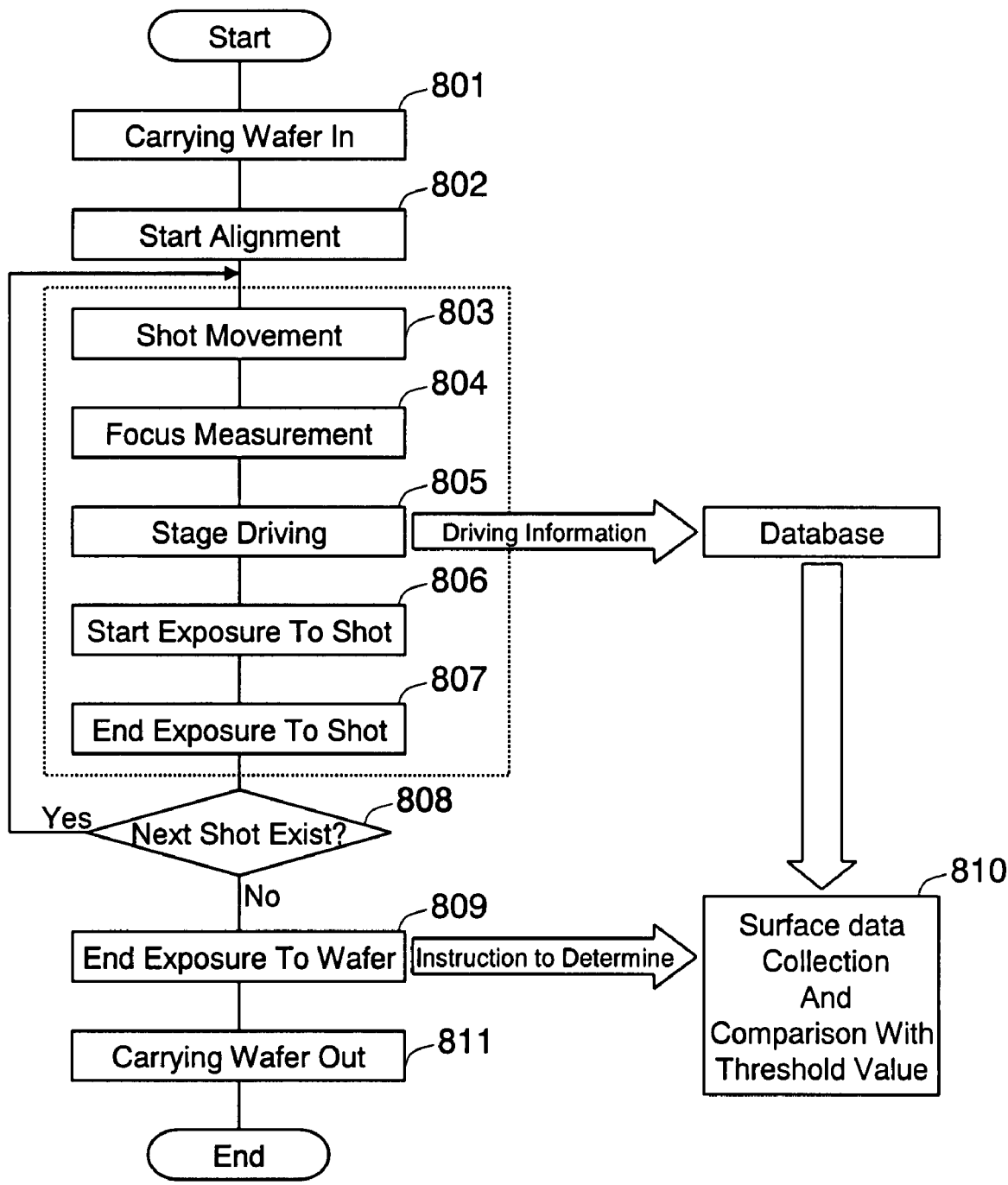
FIG. 10 is a flow chart showing the conventional exposure processes.

FIG. 1 is a schematic structural view showing a principal part of the exposure apparatus in this embodiment. As shown in FIG. 1, the exposure apparatus is provided with a wafer stage 1 on which a wafer 2 which is an object to be exposed is mounted. The wafer stage 1 is arranged below a reduction projection lens in the same manner as the conventional exposure apparatus as shown in FIG. 9. Further, the wafer stage 1 is provided with projected parts 1a, 1b and 1c, which are projecting outside of the wafer stage 1, at three positions of the outer circumference. The projected parts 1a, 1b and 1c are placed respectively on driving pins (not shown) arranged to be drivable up and down. Thus, by controlling the up-and-down movements of each driving pin, it is possible to make fine adjustment to a position of the wafer stage 1 to vertical direction and a leveling of the surface of the wafer stage 1 relative to an image plane of the reduction projection lens. The up-and-down movements of each driving pin are controlled by a driving unit 11.

The wafer stage 1 is arranged to be movable horizontal plane (to X direction and Y direction) and vertical direction (to Z direction) by an unillustrated driving unit. Hereinafter, as shown in FIG. 1, the vertical direction is described as Z direction, and directions of two axes being crossed at right angles configuring the horizontal plane are described as X direction (a direction perpendicular to a sheet in FIG. 1) and Y direction (the right-and-left direction in FIG. 1).

The wafer 2 mounted on the wafer stage 1 is applied with photoresist in advance. The surface of the wafer stage 1 is almost level and the surface of the wafer 2 mounted on the wafer stage 1 is almost level as well.

Further, the exposure apparatus in the present invention is provided with a focus sensor 5 having a light emitting unit 3 and a light receiving unit 4. A focus measurement light, whose wave length to which the photoresist is hardly sensitive, is irradiated to the surface of the wafer 2 from the light emitting unit 3. The light receiving unit 4 receives the focus measurement light irradiated by the light emitting unit 3 and reflected on the surface of the wafer 2. Using a signal generated by receiving light in the light receiving unit 4, the focus sensor 5 measures a focus value (a position to the Z direction) in a light emitting position of the focus measurement light. The focus value at a desired position on the wafer 2 is obtained by moving the wafer stage 1 within a horizontal plane. The measured focus value is stored in a storage unit 6 comprised by HDD (Hard Disk Drive) and the like, together with the position information of the wafer 2 where the focus value is measured. The measured focus value and the position information are inputted in a driving unit 11 as well. The driving unit 11 moves each driving pin up and down according to the inputted focus value.

Further, as described later on, the storage unit 6 stores a leveling value of the wafer stage 1 when the exposure is performed to the focus measurement position. With respect to an operation unit 7, a determination unit 8, an identification unit 9 and an information unit 10, the descriptions will be made later on.

Figure 2:
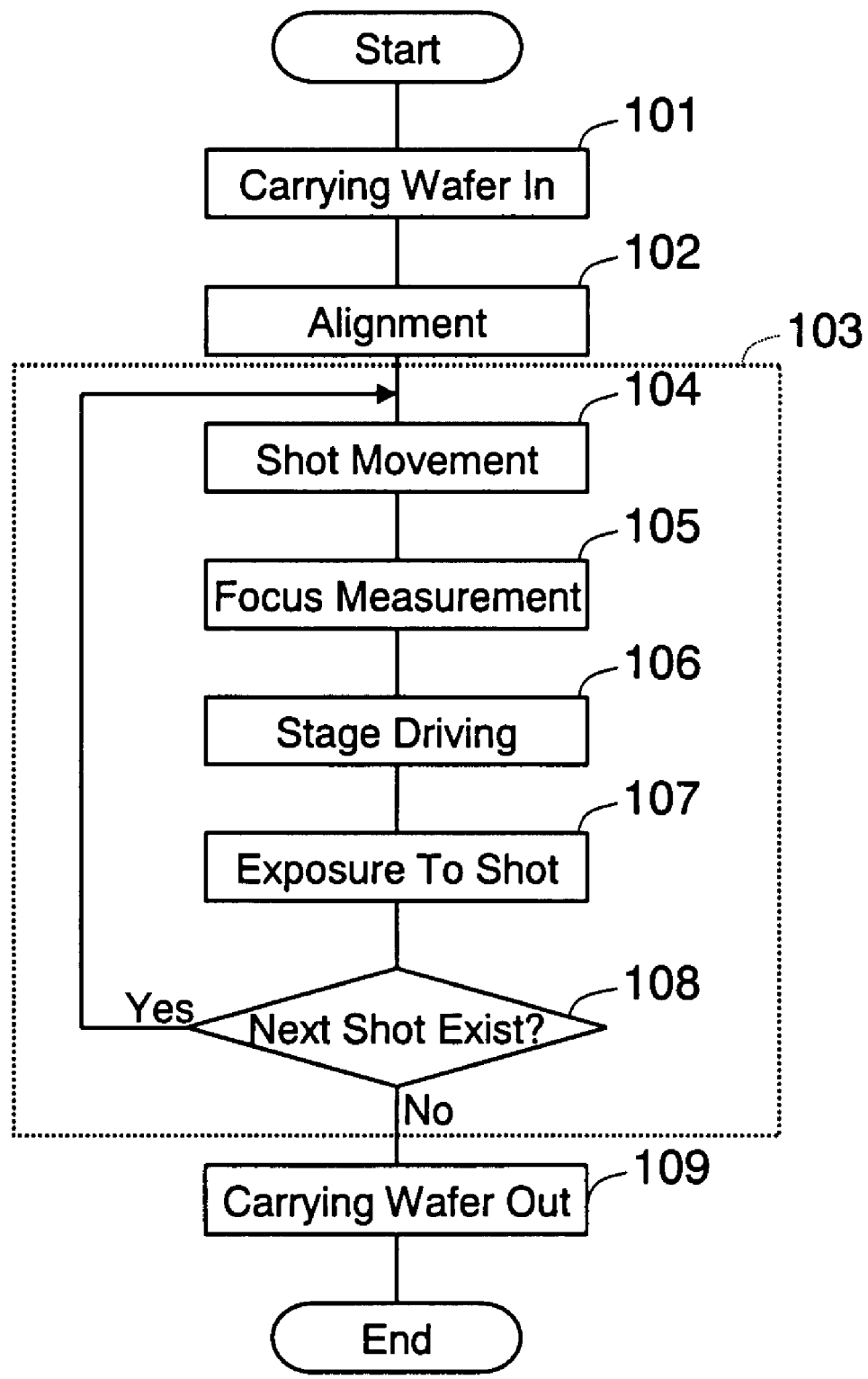
FIG. 2 is a flow chart showing an exposure process according to the first embodiment of the present invention.

FIG. 2 is a flow chart showing an exposure process according to this embodiment. As shown in FIG. 2, an unillustrated transferring unit carries the wafer 2 onto the wafer stage 1 (Step 101). Then, alignment on the wafer 2 is performed (Step 102). This alignment is to make a position of a pattern formed in advance on the wafer 2 coincide with a pattern on a reticle to be exposed on the wafer 2 in this exposure process. When the Step 102 is like the first mask exposure to the wafer 2 where it is not necessary to align the pattern on the wafer 2 with the exposure pattern, the alignment can be omitted. After that, the exposure process is started (Step 103).

In the exposure process, the movement of the wafer stage 1, in which the first exposure shot (exposure area) on the wafer 2 is moved directly below the reduction projection lens, is performed (Step 104). After completion of the shot movement, the focus measurement by the focus sensor 5 is conducted (Step 105). At this time, the focus sensor 5 measures at least two different positions in the exposure shot.

A result of the focus measurement is inputted to the driving unit 11. The driving unit 11 moves up and down each driving pin to a state that the surface of the exposure shot on the wafer 2 is coincided with the image plane of the reduction projection lens (a base plane) based on the inputted result of the focus measurement (Step 106).

For example, the focus sensor 5 or the driving unit 11 calculates, based on the measured each focus value, distance between the exposure shot surface and the image plane, and a tilt angle relative to the image plane on the exposure shot surface. According to the result of the calculation, a driving volume of each driving pin which is necessary to make the exposure shot surface coincide with the image plane is calculated. Then, by moving up and down each driving pin using only the driving volume, the driving unit 11 is able to make fine adjustment to the wafer stage 1. The fine adjustment to the wafer stage 1 may be performed by repeating the focus measurement and up-and-down movements of each driving pin until the focus values measured by the focus sensor 5 conform to the focus value of the image plane. The fine adjustment to the wafer stage 1 may be conducted in a state that the wafer stage 1 is stopped, and may be performed in a state that the wafer stage 1 is moving under the condition that a focus measurement light irradiation position of the focus sensor 5 is positioned within the exposure area. The light emitting unit 3 and the light receiving unit 4 provided in the focus sensor 5 are not limited to one pair. Depending on the number of the focus measurement positions, the focus sensor 5 may have plural pairs thereof.

After completion of the fine adjustment to the wafer stage 1, a shot number of the exposure shot, Z coordinates (Z position) of the adjusted wafer stage 1 and the adjusted leveling value are stored in the storage unit 6. Here, the shot number means the number to specify the exposure shot among the plural exposure shots arrayed on the wafer 2. In this embodiment, order of exposure on the exposure apparatus is equal to the shot number on the wafer 2. Here, the exposure apparatus performs exposure to the shot by moving in turn to the next shot being adjacent to each other on the wafer 2. In this embodiment, the tilt angle to the X direction of the wafer stage 1 (X direction leveling value) and the tilt angle to the Y direction of the wafer stage 1 (Y direction leveling value) as the leveling values are stored in the storage unit 6. The X direction leveling value and the Y direction leveling value can be calculated from the positions of each driving pin. The positions of each driving pin are easily found out by coordinates of each driving pin in the absolute coordinates system used for controlling each driving pin by the driving unit 11. Then, the Z position of the wafer stage 1 is Z coordinates of a specific point (for example, a center point of surface of the wafer stage 1) of the wafer stage 1. The Z position as well is easily found out by the coordinates of each driving pin.

After that, the shot exposure is performed and the unillustrated pattern on the reticle is transferred to the wafer 2 (Step 107). After the shot exposure is completed, and in case that the next shot to be exposed successively is on the wafer 2, the exposure to the next shot is started (Step 108 Yes, Step 104). In this case, the shot movement of the Step 104 is a stepping for one shot. On the other hand, when the next shot to be exposed is not on the wafer 2, i.e. when exposure to all shots on the wafer 2 is completed, the wafer 2 is carried out (Step 108 No, Step 109).

Figure 3:
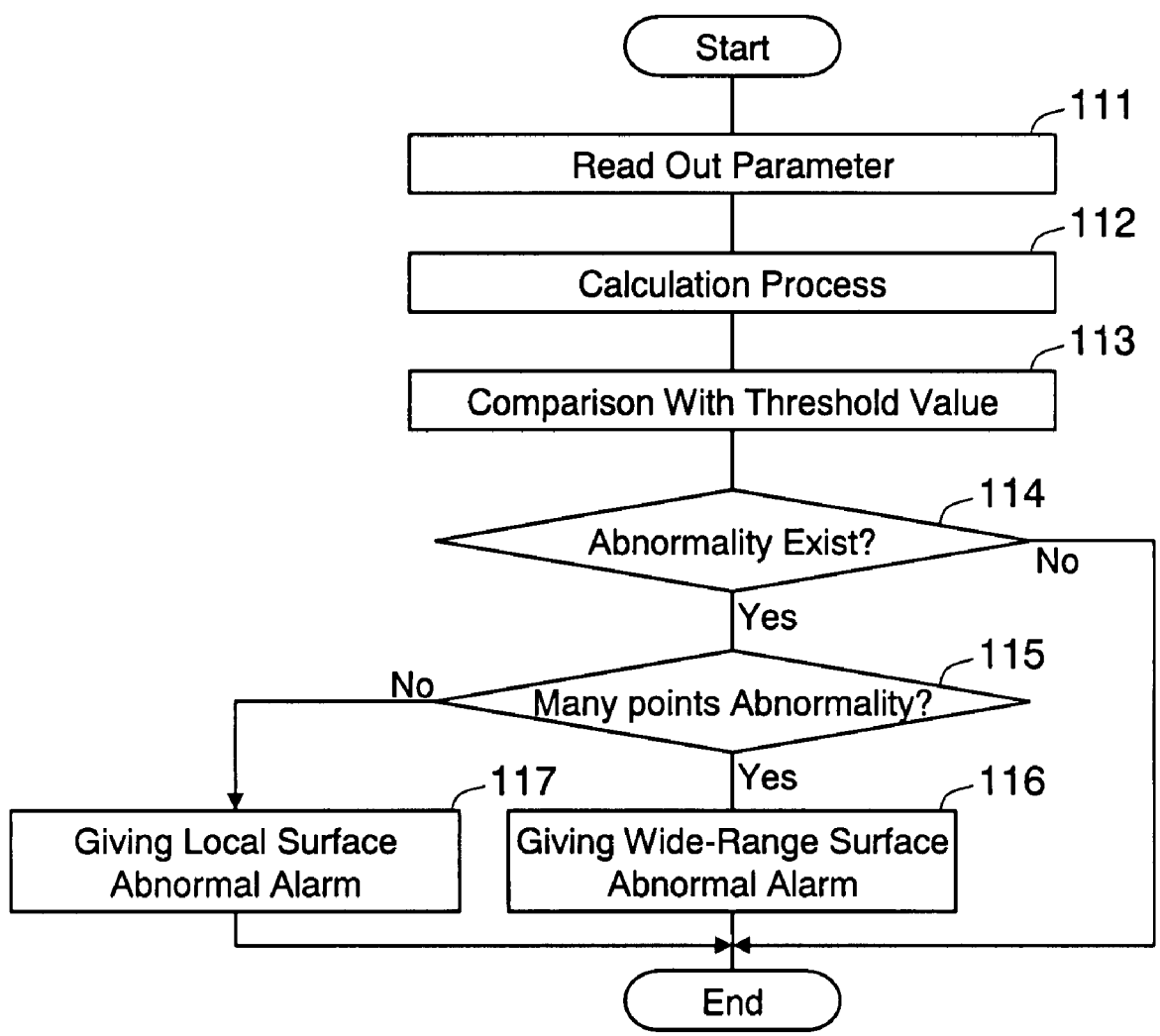
FIG. 3 is a flow chart showing a detection process of abnormalities according to the first embodiment.

In the exposure apparatus in this embodiment, after completion of the exposure to all exposure shots on the wafer 2, abnormal detection process is conducted. FIG. 3 is a flow chart showing the abnormal detection process in this embodiment.

As shown in FIG. 3, when the abnormal detection process is started, the operation unit 7 (see FIG. 1) firstly reads out a shot number of each exposure shot, the Z position of the wafer stage 1, the X direction leveling value and the Y direction leveling value those stored on the storage unit 6 (Step 111). Next, the operation unit 7 calculates differential absolute values between the Z position as $Z_i$ (i=1~n, n is a maximum value of the shot number), the X direction leveling value as $X_i$ and the Y direction leveling value as $Y_i$ in the each exposure shot, and the Z position as $Z_{i-1}$, the X direction leveling value as $X_{i-1}$ and the Y direction leveling value as $Y_{i-1}$ in the exposure shot performed immediately before the exposure shot. Then, the respective differential absolute values are obtained by $\Delta Z_i=|Z_i-Z_{i-1}|$, $\Delta X_i=|X_i-X_{i-1}|$, and $\Delta Y_i=|Y_i-Y_{i-1}|$ (Step 112). In this embodiment, the respective differential absolute values $\Delta Z_1$, $\Delta X_1$ and $\Delta Y_1$ at the first shot (i=1) are assumed to be zero.

The determination unit 8 (see FIG. 1) determines the existence/nonexistence of the exposure abnormality by comparing in turn threshold values $Z_L$, $X_L$ and $Y_L$ set in advance for the respective differential absolute values $\Delta Z_i$, $\Delta X_i$ and $\Delta Y_i$ with the respective differential absolute values $\Delta Z_i$, $\Delta X_i$ and $\Delta Y_i$ calculated by the operation unit 7 (Step 113). Here, when all of the respective differential absolute values are equal to or less than the threshold values ($\Delta Z_i \leq Z_L$, $\Delta X_i \leq X_L$, $\Delta Y_i \leq Y_L$), the determination unit 8 determines that the abnormality does not exist and the process is ended (Step 114 No). While, when even one of the respective differential absolute values $\Delta Z_i$, $\Delta X_i$ and $\Delta Y_i$ is higher than the threshold value, the determination unit 8 determines that the abnormality exists (Step 114 Yes). As described above, using the differential absolute values of the Z position, the X direction leveling value and the Y direction leveling value, the existence/nonexistence of the exposure abnormality is determined based on the minute fluctuations of the differential absolute values thereof between the adjacent exposure shots.

When the determination unit 8 determines that the abnormality exists, based on a numerical value of the abnormal occurrence points set in advance and distribution of the abnormalities, the identification unit 9 (see FIG. 1) determines whether an abnormality mode of the detected abnormality is a many points abnormal occurrence mode or a several points abnormal occurrence mode (Step 115).

In determining the abnormality mode, the identification unit 9 firstly compares the number of shots, in which respective differential absolute values $\Delta Z_i$, $\Delta X_i$ and $\Delta Y_i$ are higher than the threshold values $Z_L$, $X_L$ and $Y_L$ (the abnormal shots), with numerical values of the abnormal occurrence points (for example, 'five') set in advance. When any of the number of the abnormal shots is higher than the numerical values, the identification unit 9 determines from the shot number i in the abnormal shot whether the abnormal shot is the adjacent exposure shot on the wafer 2 or not. At this time, if the abnormal shot is the adjacent exposure shot on the wafer 2, the identification unit 9 determines it as the many points abnormal occurrence mode. That is because when each of the abnormal shot is adjacent, it is highly probable that the causes of the abnormal occurrence in the both shots are the same.

On the other hand, when the number of abnormal shots in the respective differential absolute value $\Delta Z_i$, $\Delta X_i$ and $\Delta Y_i$ are equal to or less than the numerical values of the abnormal occurrence points set in advance, and even when the number of abnormal shots in the respective differential absolute values $\Delta Z_i$, $\Delta X_i$ and $\Delta Y_i$ are higher than the numerical values of the abnormal occurrence points set in advance, if the abnormal shots are not adjacent, the identification unit 9 determines these as the several points abnormal occurrence mode.

The conditions in which the identification unit 9 determines as the many points abnormal occurrence mode may be that the abnormal exposure shots being adjacent one another continues more than predetermined times, or that a ratio of the abnormal exposure shots exceeds a predetermined ratio within a predetermined area on the wafer 2 and so forth.

When determining as the many points abnormal occurrence mode, the identification unit 9 let the information unit 10 give a wide-range surface abnormal alarm (Step 115 Yes, Step 116). Then, when determining as the several points abnormal occurrence mode, the identification unit 9 let the information unit 10 give a local surface abnormal alarm (Step 115 No, Step 117). The information unit 10 gives each abnormal alarm using arbitrary ways to be able to inform an operator, such as sound, light and an alarm display.

Then, the operator can immediately understand a kind of the exposure abnormality by a type of the given abnormal alarm. That is, when the wide-range surface abnormal alarm is given, the operator understands that the abnormality is caused by application of photoresist and the like. When the local surface abnormal alarm is given, the operator understands that the abnormality is caused by minute foreign material and the like. Consequently, the operator can promptly dispose the wafer thereafter and can specify abnormal parts in the apparatus.

The above-described threshold values set in advance in the determination unit 8 and the numerical values of abnormal occurrence points set in advance in the identification unit 9 are obtained by conducting experiments in which the actual exposure is repeatedly performed using the exposure apparatus. The operation unit 7, the determination unit 8 and the identification unit 9 can be realized, for example, by a dedicated arithmetic operation circuit, or hardware including a processor and a memory such as a RAM or ROM and software stored in the memory and running on the processor.

According to this embodiment as described above, it is possible to detect not only the abnormalities occurred locally caused by the minute foreign material attached to the rear surface of the wafer but also the abnormalities occurred over the relatively wide range caused by the abnormal application of the photoresist. These abnormalities are detected being distinguished, thereby the cause of the abnormality is specified without decreasing production capabilities and increasing in costs.

Second Embodiment

In the first embodiment, the abnormal determination is performed after completion of the exposure process, however the timing to perform the abnormal determination is not limited thereto. Therefore, in the second embodiment, an embodiment is explained by exemplifying an abnormal determination which is performed before an exposure process is started. An exposure apparatus and an exposure method according to the second embodiment are explained hereinafter referring to the drawings. A structure of the exposure apparatus in this embodiment is the same structure as the exposure apparatus described in the first embodiment, thereby the explanation thereto is omitted here.

Figure 4:
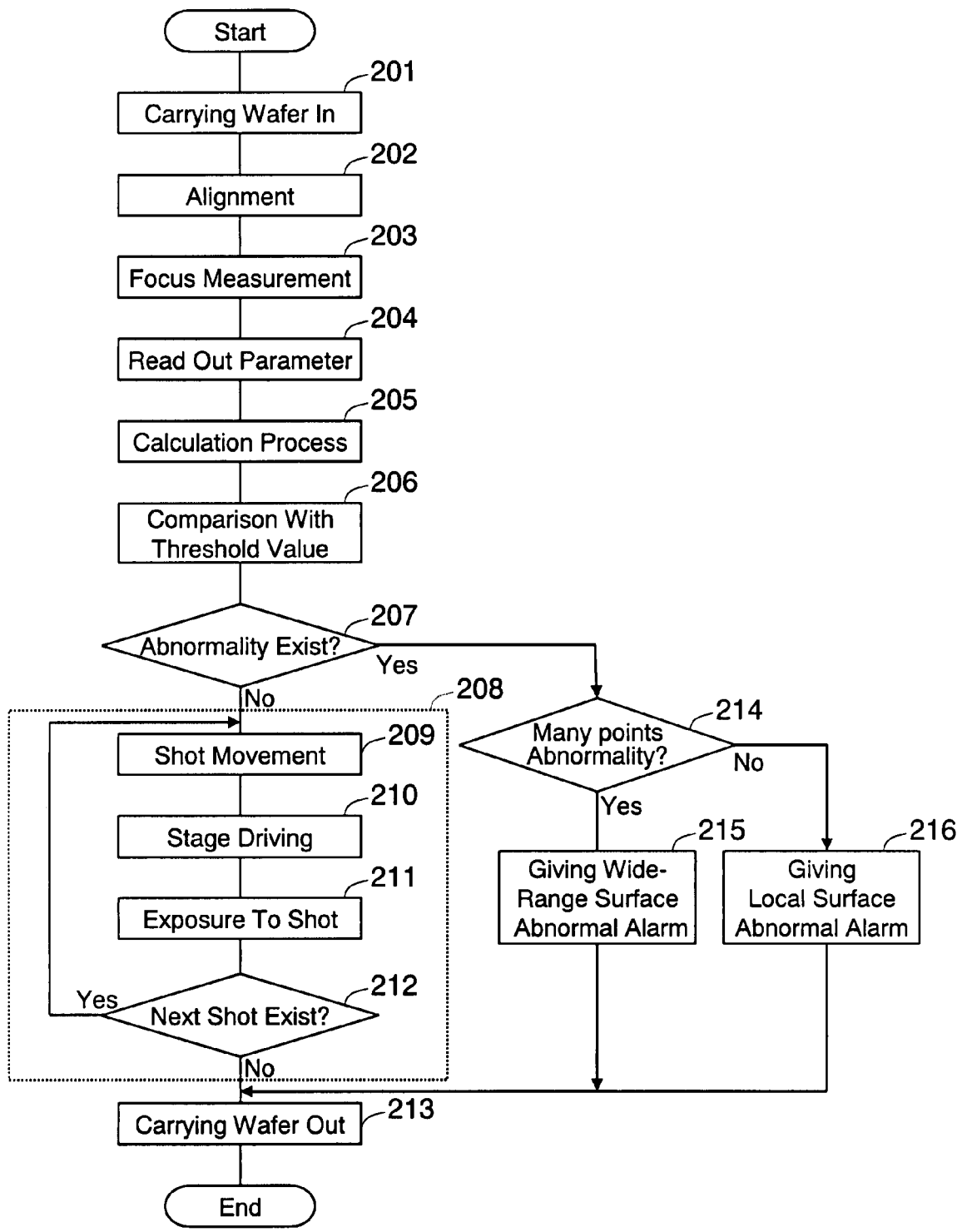
FIG. 4 is a flow chart showing an exposure apparatus (a detection process of abnormalities) according to the second embodiment.

FIG. 4 is a flow chart showing an exposure process in the exposure apparatus in this embodiment. As shown in FIG. 4, a wafer 2 is carried onto a wafer stage 1 (Step 201). Then, an alignment on the wafer 2 is performed (Step 202). This alignment is to make a position of a pattern formed in advance on a wafer coincide with a pattern to be exposed in this exposure process. Similarly to the first embodiment, when it is not necessary to align the pattern on the wafer 2 with the exposure pattern, the alignment can be omitted.

In this embodiment, after completion of the alignment, focus measurement is performed (Step 203). The focus measurement is conducted to each exposure shot on the wafer 2 by repeating movements to X direction and Y direction on the wafer stage 1 and a stop. At this time, the exposure apparatus performs the focus measurement by moving the shot in turn to the next shot being adjacent to each other on the wafer 2. Then, a focus sensor 5 conducts the focus measurement at least two different points within each exposure shot. A result of the focus measurement in each exposure shot together with shot numbers of the measured exposure shots are stored on a storage unit 6. Here, based on the measured each focus value, the focus sensor 5 calculates distance between each exposure shot surface and an image plane, and a tilt angle to the X direction and the Y direction relative to the image plane on each exposure shot surface. The focus sensor 5 calculates a driving volume of each driving pin which is necessary to make each exposure shot surface coincide with the image plane. Based on the driving volume of each driving pin, the focus sensor 5 stores Z coordinates (Z position) of the adjusted wafer stage 1, the tilt angle to the X direction (X direction leveling value), the tilt angle to the Y direction (Y direction leveling value) and the driving volume of each driving pin together with shot numbers in the storage unit 6.

After completion of the focus measurement to all exposure shots, an operation unit 7 reads out a shot number of each exposure shot, the Z position of the wafer stage 1, the X direction leveling value and the Y direction leveling value those stored on the storage unit 6 (Step 204). Next, the operation unit 7 calculates a differential absolute value, between the Z position as $Z_i$ (i=1~n, n is a maximum value of the shot number), the X direction leveling value as $X_i$ and the Y direction leveling value as $Y_i$ in the each exposure shot, and the Z position as $Z_{i-1}$, the X direction leveling value as $X_{i-1}$ and the Y direction leveling value as $Y_{i-1}$ in the exposure shot performed immediately before the exposure shot. Then, the respective differential absolute values are obtained by $\Delta Z_i = |Z_i - Z_{i-1}|$, $\Delta X_i = |X_i - X_{i-1}|$, and $\Delta Y_i = |Y_i - Y_{i-1}|$ (Step 205). In this embodiment, the respective differential absolute values $\Delta Z_1$, $\Delta X_1$ and $\Delta Y_1$ at the first shot (i=1) are assumed to be zero.

A determination unit 8 determines the existence/nonexistence of the exposure abnormality by comparing in turn threshold values $Z_L$, $X_L$ and $Y_L$ set in advance for the respective differential absolute values $\Delta Z_i$, $\Delta X_i$ and $\Delta Y_i$ with the respective differential absolute values $\Delta Z_i$, $\Delta X_i$ and $\Delta Y_i$ calculated by the operation unit 7 (Step 206). Here, when all of the respective differential absolute values are equal to or less than the threshold values ($\Delta Z_i \leq Z_L$, $\Delta X_i \leq X_L$, $\Delta Y_i \leq Y_L$), the determination unit 8 determines that the abnormality does not exist (Step 207 No). While, when even one of the respective differential absolute values $\Delta Z_i$, $\Delta X_i$ and $\Delta Y_i$ is higher than the threshold value, the determination unit 8 determines that the abnormality exists (Step 207 Yes).

When the determination unit 8 determines that the abnormality exists, as explained in the first embodiment, based on numerical values of the abnormal occurrence points set in advance and the distribution of the abnormalities, an identification unit 9 determines whether an abnormality mode of the detected abnormality is a many points abnormal occurrence mode or a several points abnormal occurrence mode (Step 214).

When determining as the many points abnormal occurrence mode, the identification unit 9 let an information unit 10 give a wide-range surface abnormal alarm (Step 214 Yes, Step 215). Then, when determining as the several points abnormal occurrence mode, the identification unit 9 let the information unit 10 give a local surface abnormal alarm (Step 214 No, Step 216). The information unit 10 gives each abnormal alarm by using an arbitrary ways to be able to inform an operator, such as sound, light and an alarm display.

Then, the operator can immediately understand a kind of the exposure abnormality by a type of the given abnormal alarm. Then, the operator can promptly dispose the wafer thereafter and can specify abnormal parts in the apparatus.

In the meantime, in case that the determination unit 8 determines that the abnormality does not exist, the exposure process (Step 208) is performed. In the exposure process, the movement of the wafer stage 1, in which the first exposure shot (exposure area) on the wafer 2 is moved directly below the reduction projection lens, is performed (Step 209). After completion of the shot movement, the driving unit 11 reads out the driving volume of each control pin relative to the exposure shot from the storage unit 6, and, according to the driving volume, moves up and down each driving pin (Step 210).

After that, the shot exposure is performed and a pattern on a reticle is transferred to the wafer 2 (Step 211). After the shot exposure is completed, and in case that the next shot to be exposed successively is on the wafer 2, the exposure to the next shot is started (Step 212 Yes, Step 209). In this case, the shot movement of the Step 209 is a stepping for one shot. On the other hand, when the next shot to be exposed is not on the wafer 2, i.e. when the exposure to all shots on the wafer 2 is completed, the wafer 2 is carried out (Step 212 No, Step 213).

According to this embodiment as described above, it is possible to detect not only the abnormalities occurred locally caused by the minute foreign material attached to the rear surface of the wafer but also the abnormalities occurred over the relatively wide range caused by the abnormal application of the photoresist. These abnormalities are detected being distinguished, thereby the cause of the abnormality is specified without decreasing production capabilities and increasing in costs.

Further, in this embodiment, a focus measurement during the exposure process (Step 208) is omitted, however, a structure to add conducting the focus measurement can be allowed.

Third Embodiment

In the first and second embodiments, the structure of which the exposure apparatus gives the operator the wide-range surface abnormal alarm and the local surface abnormal alarm is explained. In this structure, after checking the abnormal alarm, the operator needs to dispose the wafer thereafter, and specify and restore abnormal parts in the apparatus. Therefore, in this embodiment, the structure, wherein disposition after the abnormal alarm is given is automatically conducted, is explained. Hereinafter, the third embodiment is explained referring to the drawings.

Figure 5:
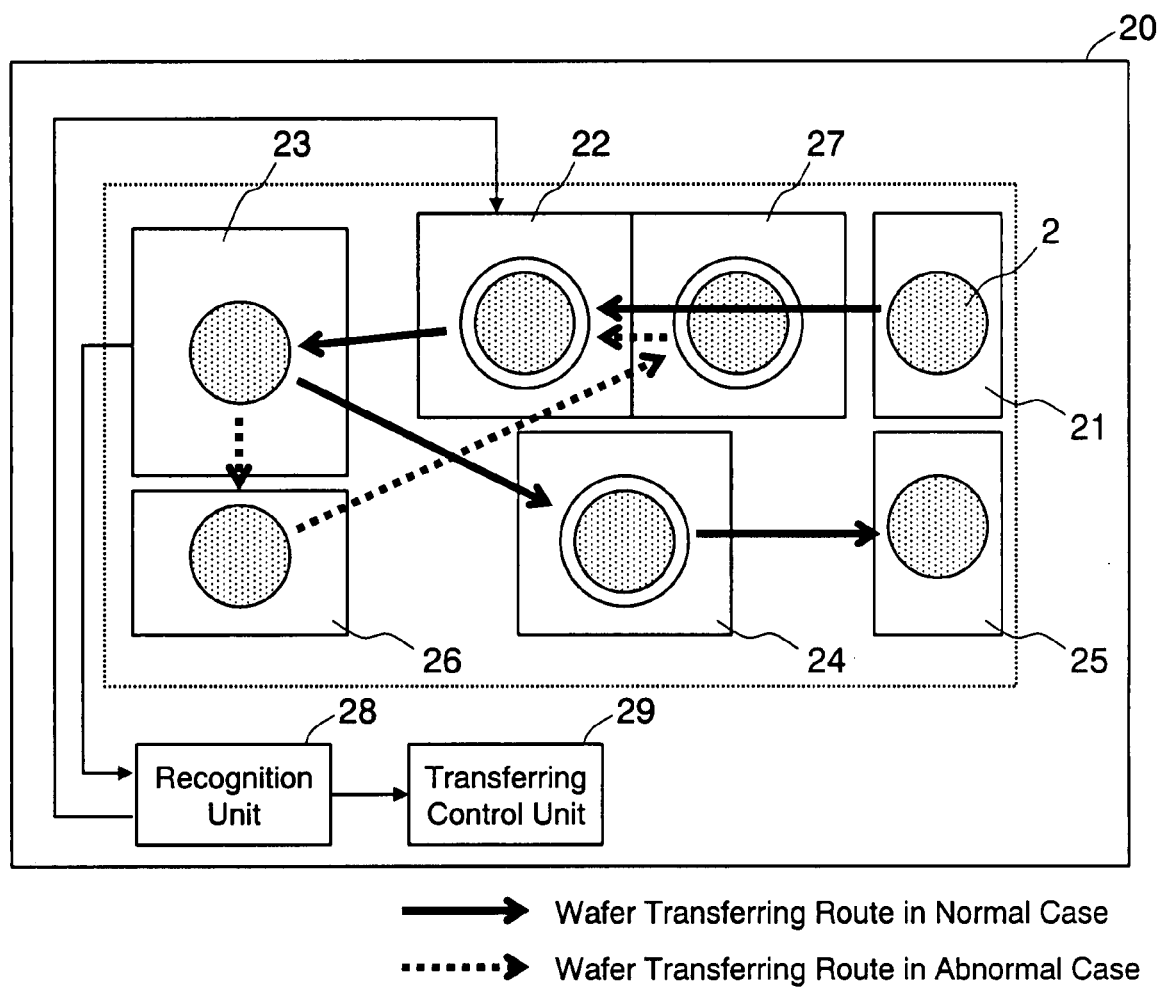
FIG. 5 is a schematic structural view showing an exposure apparatus according to the third embodiment of the present invention.

FIG. 5 is a schematic structural view showing a principal part of an exposure apparatus in which the exposure apparatus is provided as an exposure unit. As shown in FIG. 5, an exposure apparatus 20 is provided with a wafer loader 21 in which a container contained a plurality of wafers which are object to be exposed is arranged. A wafer 2 carried out from the wafer loader 21 is carried onto an application unit 22. In the application unit 22, the wafer 2 is applied with photoresist on the surface to be exposed. The wafer 2 applied with the photoresist is carried onto an exposure unit 23. Here, the exposure unit 23 is the exposure apparatus explained in the first and second embodiments, and the exposure to the wafer 2 is performed by the above-described process.

After the exposure operation to the wafer 2 is normally completed in the exposure unit 23, the wafer 2 is carried out from the exposure unit 23 and is carried onto a development unit 24. In the development unit 24, the wafer 2 after the exposure operation is developed, thereby a photoresist pattern is formed on the wafer 2. The wafer 2 after completion of the development is carried out from the development unit 24 and is transferred to a wafer unloader 25. Then the wafer 2 is contained into a container arranged in a wafer unloader 25.

A resist removal unit 27, wherein the photoresist applied on the wafer 2 is removed, is arranged between the wafer loader 21 and the application unit 22. At an adjacent position to the exposure unit 23, a buffer unit 26, wherein the wafer 2 to which an abnormality is detected in the exposure unit 23 is temporarily held, is arranged.

In FIG. 5, it is not illustrated but transferring the wafer 2 between each unit is conducted by a well-known and commonly used wafer carrier robot. With respect to a hot plate unit, a cleaning unit and an adhesion process unit and so forth, which are usually provided with the exposure apparatus wherein the object to be exposed is carried on and a wafer which is exposed and developed is carried out, an explanation and an illustration on the drawings are omitted because these do not directly relate to the explanation of this embodiment.

Figure 6:
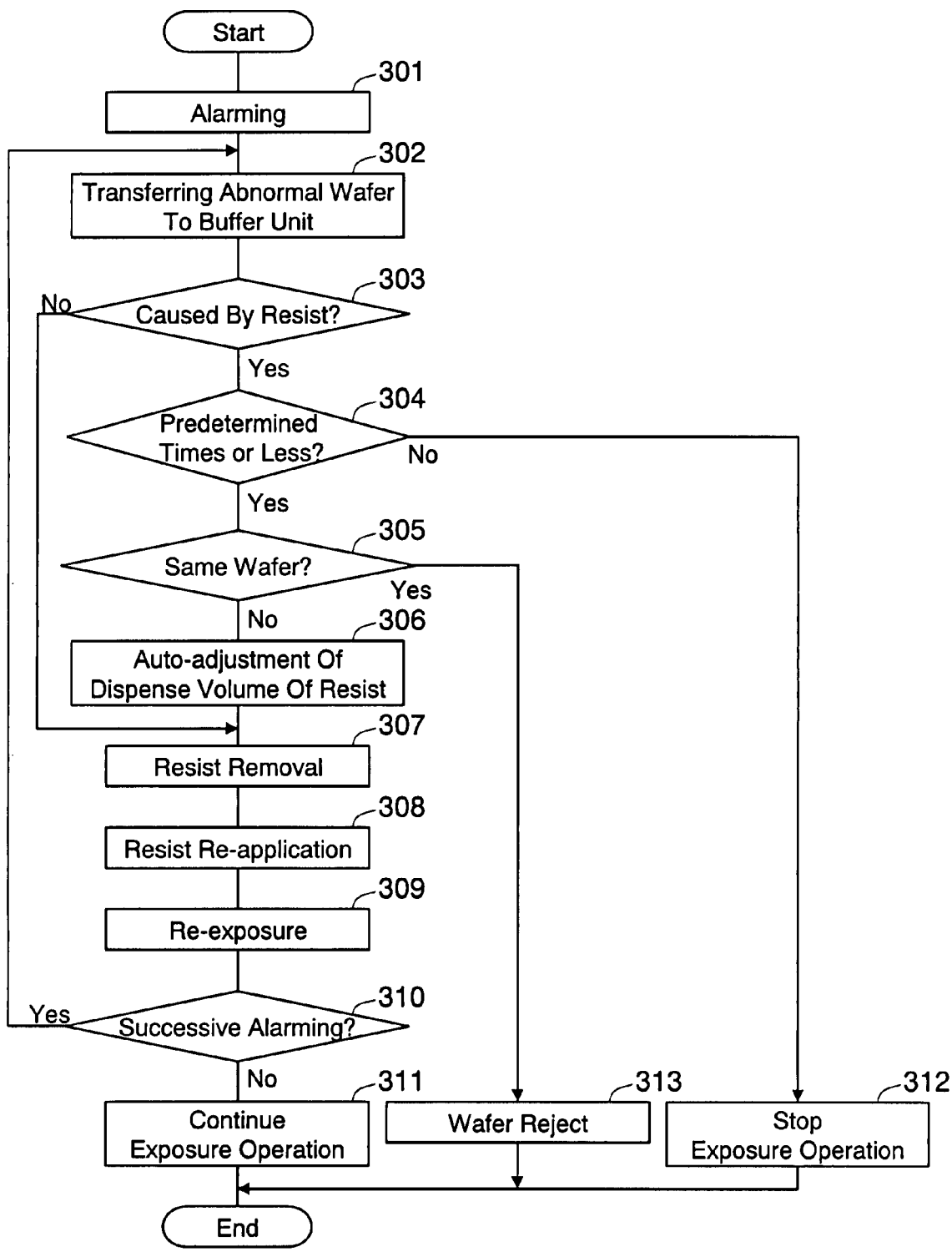
FIG. 6 is a flow chart showing an exposure process according to the third embodiment of the present invention.

FIG. 6 is a flow chart showing a process when the exposure unit 23 gives an abnormal alarm in the exposure apparatus 20 in this embodiment. In normal operation when the exposure unit 23 does not give the abnormal alarm, the process is performed successively through the above-described transferring route (indicated by solid line with arrow in FIG. 5).

In case that the exposure unit 23 detects the exposure abnormality by the above-described process, the exposure unit 23 gives the abnormal alarm (Step 301). At this time, the exposure unit 23 transfers the wafer 2, on which the abnormality is occurred, to the buffer unit 26 (Step 302). A recognition unit 28 (see FIG. 5) in the exposure apparatus 20 recognizes whether the abnormality to which the abnormal alarm is given is caused by the resist application (Step 303). In this embodiment, when the given abnormal alarm is a wide-range surface abnormal alarm, it is recognized that the abnormality is caused by the resist application. When the alarm is a local surface abnormal alarm, it is recognized that the abnormality is not caused by the resist application. The recognition unit 28 stores information to identify the wafer 2 on which the abnormality is occurred. As the information to identify the wafer 2, a wafer number and the like which are usually used for a process control in manufacturing process for semiconductor devices, can be utilized.

The abnormality caused by the resist application means a condition that the photoresist is not applied uniformity on the wafer 2. A cause of ununiformity application of the photoresist on the wafer 2 is that the abnormality is generally occurred by a dispensing volume of the photoresist in the application unit 22. Therefore, in this embodiment, in case that the recognition unit 28 recognizes as the abnormality caused by resist application, the recognition unit 28 instructs a transferring control unit 29 (see FIG. 5), which controls the transferring conditions of the wafer transferring robot, to stop transferring the wafer 2 from the wafer loader 21 to the application unit 22, and concurrently instructs the application unit 22 to automatically adjust the dispense volume of the photoresist (Step 303 Yes, Step 304 Yes, Step 305 No, Step 306). Here, an auto-adjustment process of dispense volume is a process to adjust the dispense volume of the photoresist automatically in the application unit 22 to a state that the desired film thickness of the photoresist is applied on the wafer 2. Such auto-adjustment process of dispense volume is a well-known and commonly used prior art, thereby the detailed explanation is omitted here. With respect to Step 304 and Step 305, description will be made later on.

After completion of the auto-adjustment process of dispense volume in the application unit 22, or in parallel with the auto-adjustment process of dispense volume in the application unit 22, the recognition unit 28 instructs the transferring control unit 29 to transfer the wafer 2, in which the abnormality is occurred, and which is held in the buffer unit 26. According to the instructions, the wafer 2 to which the abnormality is occurred is transferred to the resist removal unit 27. In the resist removal unit 27, the photoresist on the wafer 2 to which the abnormality is occurred is peeled off (Step 307). Peeling off the photoresist, for example, is conducted by dropping thinner on the wafer 2. Thinner is used as a solvent for the photoresist applied on the wafer 2. Depending on the condition of the wafer 2 surface, ashing, SPM cleaning or removal liquid is also used for peeling off the photoresist.

The wafer 2 on which the photoresist is peeled off is transferred to the application unit 22 and is re-applied the photoresist to the exposure surface thereof (Step 308). The wafer 2 on which the photoresist is re-applied is re-transferred to the exposure unit 23 and exposed (Step 309). In FIG. 5, the transferring route of the wafer 2 when the abnormality is caused by the resist application is shown by broken lines with arrows.

Succeeding to the wafer 2 to which the abnormality is occurred, if the abnormality caused by resist application is not occurred to the wafer 2 exposed in the exposure unit 23, the exposure operation through the normal wafer transferring route is continued (Step 310 No, Step 311). The wafer 2, which is to be exposed in the exposure unit 23 succeeding to the wafer 2 to which the abnormality is occurred, is preferably the wafer 2 on which the photoresist is re-applied, however other wafer 2 is allowable. Here, other wafer 2 is the wafer 2 on which the application of the photoresist is completed on the application unit 22 before the auto-adjustment of the dispense volume of the photoresist is started, and is held for being transferred to the exposure unit 23.

On the other hand, in case that in the exposure unit 23, the abnormality caused by resist application is successively occurred to the succeeded wafers 2, the recognition unit 28 stops the exposure operation when the number of occurrence times is exceeded predetermined times (Step 310 Yes, Step 302, Step 303 Yes, Step 304 No, Step 312). In case that the succeeded wafer 2 is a wafer on which the application of the photoresist is completed before the application unit 22 starts the auto-adjustment of dispense volume of the photoresist, it is needless to say that the predetermined times are set more than the number of this kind of wafer 2.

In this embodiment, when recognizing that the abnormality is not caused by the resist application (a local surface abnormal alarm), the recognition unit 28 instructs the transferring control unit 29 to stop transferring the wafer 2 from the wafer loader 21 to the application unit 22, and instructs the transferring control unit 29 to transfer the wafer 2 in which the abnormality is occurred to the resist removal unit 27 (Step 303 No, Step 307). After peeling off the photoresist on the wafer 2, the photoresist is re-applied and the re-exposure is operated (Step 308, Step 309). In spite of the result of the recognition unit 28, in case that the abnormality is occurred to the re-exposed wafer 2, the recognition unit 28 rejects the wafer 2 as a defective (Step 305 Yes, Step 313).

According to this embodiment as described above, when the abnormality is occurred by the cause of the resist application, the restoration is performed automatically. Consequently, time loss for disposition caused by the exposure abnormality can be minimized. When the automatic restoration can not be performed, expansion of damages is prevented by stopping the process.

The recognition unit 28 can be realized, for example, by a dedicated arithmetic operation circuit, or hardware including a processor and a memory such as a RAM or ROM and software stored in the memory and running on the processor.

Fourth Embodiment

In this embodiment, the information unit 10 as explained in the first and second embodiments comprises a display device. Examples of displays of the wide-range surface abnormal alarm and the local surface abnormal alarm displayed on the display device are explained hereinafter.

Figure 7A:
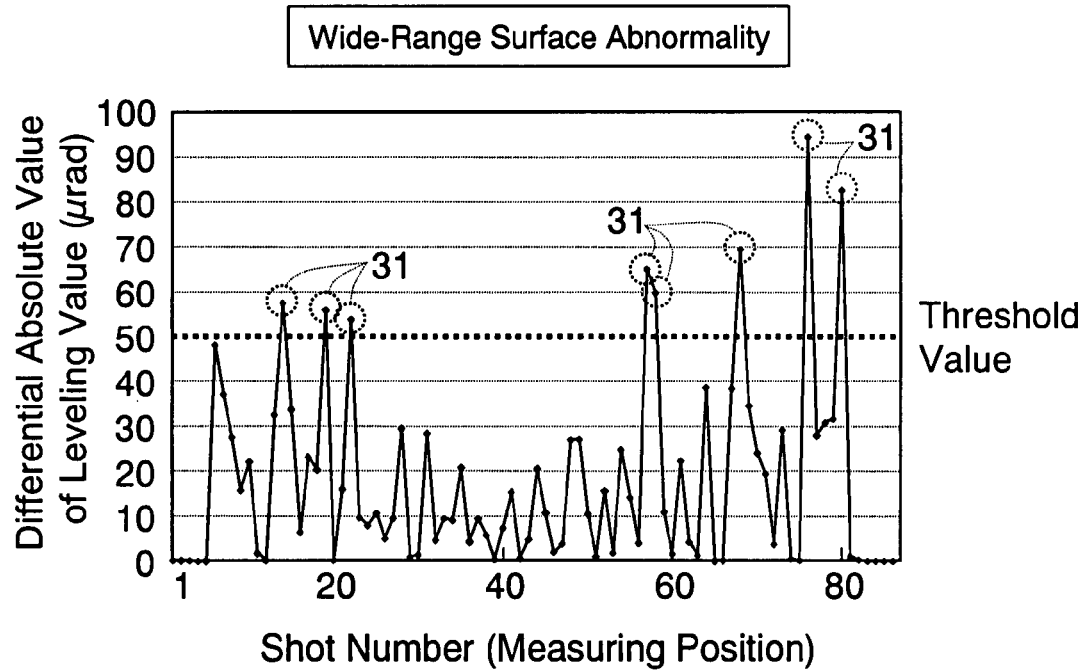
FIG. 7A and FIG. 7B are a view showing a display for abnormalities according to the fourth embodiment of the present invention.
Figure 7B:
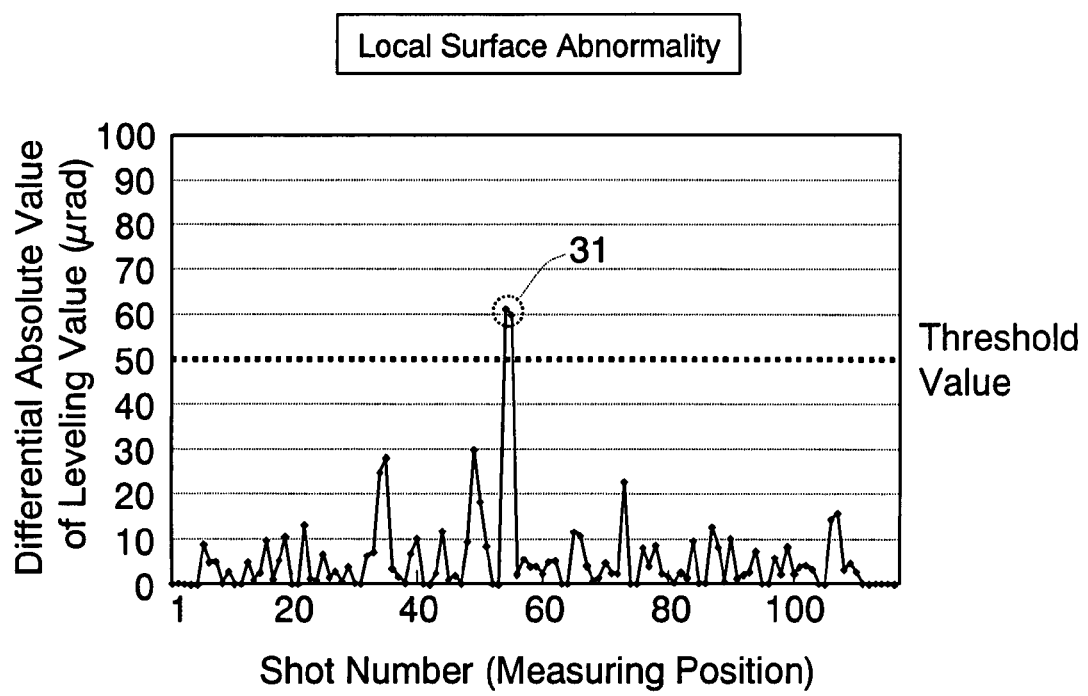

FIG. 7A and FIG. 7B show examples of differential absolute values $\Delta X_i$ of X direction leveling values arranged in shot number i order. In FIG. 7, shot numbers (measuring positions) are in horizontal axes and the differential absolute values $\Delta X_i$ of X direction leveling values are in vertical axes. FIG. 7A is an example of a display showing a wide-range surface abnormal alarm, and FIG. 7B is an example of a display showing a local surface abnormal alarm.

In FIG. 7A and FIG. 7B, by displaying threshold values set in advance and the measuring positions, positions of the abnormal determination and shifts from the threshold value become visible. Data with circle 31 formed by dotted line indicated in FIG. 7A and FIG. 7B are positions where the abnormalities are occurred.

Figure 8A:
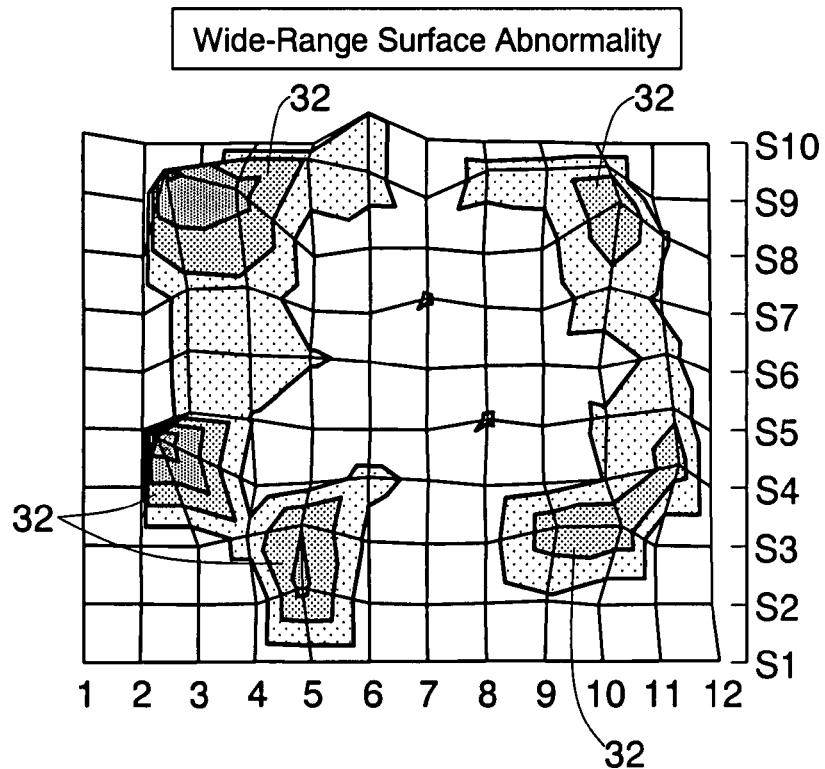
FIG. 8A and FIG. 8B are a view showing a display for abnormalities according to the fourth embodiment of the present invention.
Figure 8B:
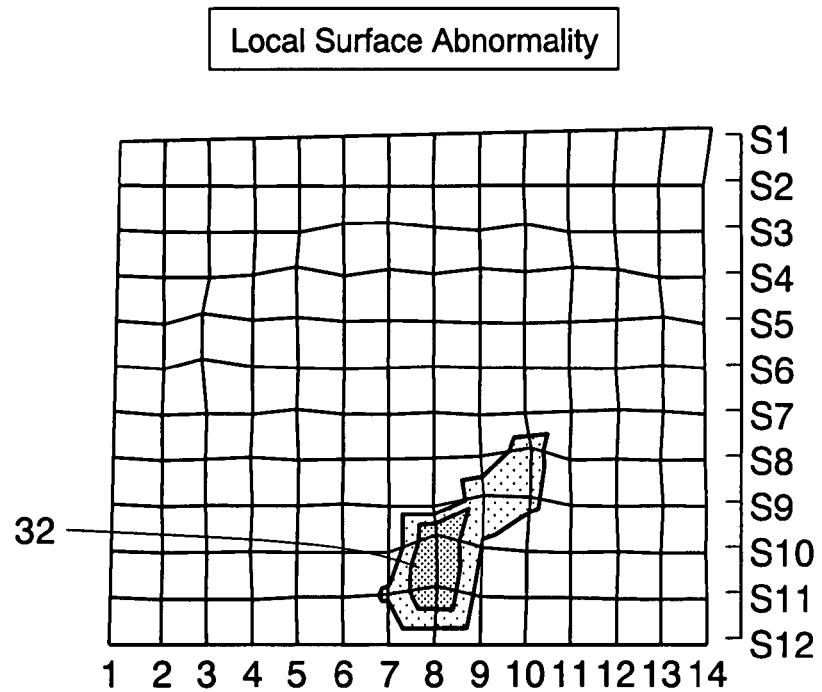

FIG. 8A and FIG. 8B show examples of the differential absolute values of the leveling values of X direction displayed by a wafer map format. In FIG. 8A and FIG. 8B, the X direction on the wafer is in horizontal axes and the Y direction on the wafer is in vertical axes. Further, in FIG. 8, the differential absolute values of the leveling values of the X direction are presented in contour. Here, contours are calculated as values of one point within the exposure shot (here, a center of the exposure shot) on the wafer map, and the values are relative to the differential absolute values of the leveling values of the X direction. FIG. 8A is an example of a display showing the wide-range surface abnormal alarm, and FIG. 8B is an example of a display showing the local surface abnormal alarm.

In the example shown in FIG. 8A and FIG. 8B, according to magnitude of the differential absolute values, regions surrounded by contours relative to predetermined values are displayed by color-coding. Then, abnormal points and the sizes of the regions become visible. In FIG. 8A and FIG. 8B, the regions surrounded by contours relative to the predetermined values are shown in grayscale, however these may be shown in color. Inside regions of regions 32 are points where the abnormalities are occurred.

As shown in FIGS. 7A and 8A, in case of the wide-range surface abnormal alarm, points where the abnormalities are occurred are recognized many. Particularly in FIG. 8A, it is recognized that the regions 32 where the abnormalities are occurred are extending over wide-ranges. On the other hand, as shown in FIGS. 7B and 8B, in case of the local surface abnormal alarm, points where the abnormalities are occurred are recognized one by one. In FIG. 8B, it is recognized that the region 32 where the abnormalities are occurred is small.

In FIGS. 7A, 7B, 8A and 8B, with respect to the differential absolute values of the leveling values of the X direction, examples of the displays of the wide-range surface abnormal alarm and the local surface abnormal alarm are shown, however, with respect to differential absolute value of Z position and Y direction leveling value as well, displaying in the same manner is possible.

When the exposure abnormality is detected on the wafer, and the abnormal alarm using the display as explained is given, the operator can easily understand the circumstances of the abnormal occurrence.

The present invention is not limited to the embodiments as explained above, however, it is variously modifiable and applicable within the scope to which this invention is effective. For example, although the examples in each embodiment are applicable to the manufacturing process of the semiconductor device, the present invention is applicable to that of liquid crystal panel and the like as well. In each embodiment as described above, the examples applied to a step-and-repeat system exposure apparatus are explained, however, the present invention is applicable to a step-and-scan system exposure apparatus as well.

The present invention has effects to detect an exposure abnormality and to be able to identify kinds of an exposure abnormality concurrently, and is useful as an exposure apparatus and an exposure method.

What is claimed is:

1. An exposure apparatus measuring a surface position of an object to be exposed mounted on a stage and exposing a surface of the object in a state that the object surface is coincided with a base plane set at a desired position, comprising:
    a unit measuring the surface position of the object at least more than two points within an exposure area;
    a unit calculating a distance between the base plane and the object surface and a leveling value of the object surface relative to the base plane in a plurality of exposure areas arranged on the object based on a result of the measurement by the measuring unit;
    a unit storing the calculated distance and the calculated leveling value in association with position information of the exposure area performed the calculation on the object surface;
    a unit determining existence or nonexistence of an exposure abnormality based on the associated information and predetermined abnormal determination criteria; and
    a unit identifying a kind of the exposure abnormality, in case that the determining unit determines that the exposure abnormality exists, at least based on the number of the exposure areas where the exposure abnormality is occurred and distribution of the exposure areas where the exposure abnormality is occurred on the object surface.

2. An exposure apparatus according to claim 1, further comprising:
    a unit displaying the result of the existence or the nonexistence of the exposure abnormality determined by the determining unit together with information of the object including the position information of the exposure area on the object surface and information to identify the object.

3. An exposure apparatus according to claim 1, wherein the identifying unit identifies the exposure abnormality as the exposure abnormality caused by foreign material on a rear surface of the object when the exposure abnormality does not exist in exposure areas adjacent to the exposure area where the exposure abnormality is detected.

4. An exposure apparatus according to claim 2, wherein the identifying unit identifies the exposure abnormality as the exposure abnormality caused by foreign material on a rear surface of the object when the exposure abnormality does not exist in exposure areas adjacent to the exposure area where the exposure abnormality is detected.

5. An exposure apparatus according to claim 1, wherein the identifying unit identifies the exposure abnormality as the exposure abnormality caused by application of chemical solution applied on the object surface when the exposure abnormalities exist in the exposure areas adjacent to the exposure area where the exposure abnormality is detected.

6. An exposure apparatus according to claim 2, wherein the identifying unit identifies the exposure abnormality as the exposure abnormality caused by application of chemical solution applied on the object surface when the exposure abnormalities exist in the exposure areas adjacent to the exposure area where the exposure abnormality is detected.

7. An exposure apparatus according to claim 1, further comprising:
    a unit calculating difference between the calculated value in each exposure area and the calculated value in the exposure area where the surface position is measured immediately before the each exposure area with respect to the distance and the leveling value respectively; and
    wherein the determining unit determines the existence or the nonexistence of the exposure abnormality by comparing the difference in the distance and the difference in the leveling value with predetermined threshold values for the respective differences.

8. An exposure apparatus according to claim 2, further comprising:
    a unit calculating difference between the calculated value in each exposure area and the calculated value in the exposure area where the surface position is measured immediately before the each exposure area with respect to the distance and the leveling value respectively; and
    wherein the determining unit determines the existence or the nonexistence of the exposure abnormality by comparing the difference in the distance and the difference in the leveling value with predetermined threshold values for the respective differences.

9. An exposure apparatus according to claim 2, wherein the displaying unit displays by distinguishing areas determined as abnormal with areas determined as normal by the determining unit on a map showing the object surface.

10. An exposure method measuring a surface position of an object to be exposed mounted on a stage and exposing a surface of the object in a state that the object surface is coincided with a base plane set at a desired position, comprising the steps of:
    measuring the surface position of the object at least more than two points within an exposure area;
    calculating a distance between the base plane and the object surface and a leveling value of the object surface relative to the base plane in a plurality of exposure areas arranged on the object based on a result of the measurement;
    associating the calculated distance and the calculated leveling value with position information of the exposure area performed the calculation on the object surface;
    determining existence or nonexistence of an exposure abnormality based on the associated information and predetermined abnormal determination criteria; and
    identifying a kind of the exposure abnormality, in case that the exposure abnormality is determined as existing, at least based on the number of the exposure areas where the exposure abnormality is occurred and distribution of the exposure areas where the exposure abnormality is occurred on the object surface.

11. An exposure method according to claim 10, further comprising the step of:
    displaying the determined result of the existence or the nonexistence of the exposure abnormality together with information of the object including the position information of the exposure area on the object surface and information to identify the object.

12. An exposure method according to claim 10, wherein, in the step of identifying a kind of the exposure abnormality, the exposure abnormality is identified as the exposure abnormality caused by foreign material on a rear surface of the object when the exposure abnormality does not exist in exposure areas adjacent to the exposure area where the exposure abnormality is detected.

13. An exposure method according to claim 11, wherein, in the step of identifying a kind of the exposure abnormality, the exposure abnormality is identified as the exposure abnormality caused by foreign material on a rear surface of the object when the exposure abnormality does not exist in exposure areas adjacent to the exposure area where the exposure abnormality is detected.

14. An exposure method according to claim 10, wherein, in the step of identifying the existence or the nonexistence of the exposure abnormality, the exposure abnormality is identified as the exposure abnormality caused by application of chemical solution applied on the object surface when exposure abnormalities exist in exposure areas adjacent to the exposure areas where the exposure abnormality is detected.

15. An exposure method according to claim 11, wherein, in the step of identifying the existence or the nonexistence of the exposure abnormality, the exposure abnormality is identified as the exposure abnormality caused by application of chemical solution applied on the object surface when exposure abnormalities exist in exposure areas adjacent to the exposure areas where the exposure abnormality is detected.

16. An exposure method according to claim 10, further comprising the step of:
calculating difference between the calculated value in each exposure area and the calculated value in the exposure area where the surface position is measured immediately before the each exposure area with respect to the distance and the leveling value respectively; and
wherein the determination of the existence or the nonexistence of the exposure abnormality is performed by comparing the difference in the distance and the difference in the leveling value with predetermined threshold values for the respective differences.

17. An exposure method according to claim 11, further comprising the step of:
calculating difference between the calculated value in each exposure area and the calculated value in the exposure area where the surface position is measured immediately before the each exposure area with respect to the distance and the leveling value respectively; and
wherein the determination of the existence or the nonexistence of the exposure abnormality is performed by comparing the difference in the distance and the difference in the leveling value with predetermined threshold values for the respective differences.

18. An exposure method according to claim 11, wherein a result of the existence or the nonexistence of the exposure abnormality is displayed by distinguishing areas determined as abnormal with areas determined as normal on a map showing the object surface.

19. An exposure method according to claim 10, further comprising the steps of;
when being determined that the exposure abnormality exists in the step of determining the existence or the nonexistent of the exposure abnormality, removing chemical solution applied on the surface of the object which is determined that the exposure abnormality exists; and
re-applying chemical solution on the surface of the object where the chemical solution is removed.

20. An exposure method according to claim 11, further comprising the steps of;
when being determined that the exposure abnormality exists in the step of determining the existence or the nonexistent of the exposure abnormality, removing chemical solution applied on the surface of the object which is determined that the exposure abnormality exists; and
re-applying chemical solution on the surface of the object where the chemical solution is removed.

21. An exposure method according to claim 19, wherein, in case that the chemical solution is photoresist, the photoresist is removed from the object which is determined as abnormal by applying thinner used as a solvent for the photoresist.

22. An exposure method according to claim 20, wherein, in case that the chemical solution is photoresist, the photoresist is removed from the object which is determined as abnormal by applying thinner used as a solvent for the photoresist.

* * * * *